US008946875B2

(12) United States Patent
Kelkar et al.

(10) Patent No.: US 8,946,875 B2
(45) Date of Patent: Feb. 3, 2015

(54) PACKAGED SEMICONDUCTOR DEVICES INCLUDING PRE-MOLDED LEAD-FRAME STRUCTURES, AND RELATED METHODS AND SYSTEMS

(71) Applicant: Intersil Americas LLC, Milpitas, CA (US)

(72) Inventors: Nikhil Vishwanath Kelkar, Saratoga, CA (US); Lynn Wiese, Santa Clara, CA (US); Viraj Ajit Patwardhan, Milpitas, CA (US)

(73) Assignee: Intersil Americas LLC, Milpitas, CA (US)

( * ) Notice: Subject to any disclaimer, the term of this patent is extended or adjusted under 35 U.S.C. 154(b) by 0 days.

(21) Appl. No.: 13/629,297

(22) Filed: Sep. 27, 2012

(65) Prior Publication Data

US 2013/0187260 A1 Jul. 25, 2013

Related U.S. Application Data

(60) Provisional application No. 61/588,769, filed on Jan. 20, 2012.

(51) Int. Cl.
| | |
|---|---|
| H01L 23/495 | (2006.01) |
| H01L 23/48 | (2006.01) |
| H01L 23/04 | (2006.01) |
| H01L 23/12 | (2006.01) |

(52) U.S. Cl.
USPC ........... 257/676; 257/669; 257/693; 257/730; 257/731

(58) Field of Classification Search
USPC ......... 257/676, 787, 792, 793, 669, 672, 674, 257/690, 730, 731
See application file for complete search history.

(56) References Cited

U.S. PATENT DOCUMENTS

| | | | |
|---|---|---|---|
| 4,195,193 A | 3/1980 | Grabbe et al. | |
| 5,106,784 A | 4/1992 | Bednarz | |
| 5,213,748 A | 5/1993 | Biswas et al. | |
| 5,258,646 A | 11/1993 | Katoh | |
| 6,097,084 A * | 8/2000 | Sano et al. | 257/678 |
| 6,476,478 B1 * | 11/2002 | Swiss et al. | 257/692 |
| 6,893,898 B2 * | 5/2005 | Ito et al. | 438/108 |
| 7,030,471 B2 | 4/2006 | Perillat | |

(Continued)

OTHER PUBLICATIONS

Actel, "Assembly and PCB Layout Guidelines for QFN Packages", May, 2008, pp. 1-14.

(Continued)

*Primary Examiner* — A. Sefer
*Assistant Examiner* — Dilinh Nguyen
(74) *Attorney, Agent, or Firm* — Vierra Magen Marcus LLP

(57) ABSTRACT

A packaged semiconductor device includes at least first and second lead-fingers. A molded structure forms a cavity and is molded around portions of each of the first and second lead-fingers to thereby mechanically attach each of the first and second lead-fingers to the molded structure. A semiconductor structure (e.g., a IC, chip or die) is attached within the cavity. First and second bond wires respectively providing electrical connections between the semiconductor structure and the first and second lead-fingers. A further portion of each of the first and second lead-fingers is mechanically attached to a bottom surface of the semiconductor structure to inhibit relative mechanical motion between the semiconductor structure, the molded structure and the first and second lead-fingers.

16 Claims, 5 Drawing Sheets

(56) References Cited

U.S. PATENT DOCUMENTS

2010/0016928 A1* 1/2010 Zdeblick et al. ............ 607/72
2011/0050626 A1* 3/2011 Porter et al. ............ 345/174

OTHER PUBLICATIONS

Wikipedia, "Quad-Flat No-Leads Package", http://en.wikipedia.org/w/index.php?title=Quad-flat_no-leads_package&oldid=494162181, printed Sep. 25, 2012.

Davis, Leroy, "Electronic Engineering Glossary Terms", Dictionary of Electronic and Engineering Terms: IC Semiconductor Cavity Orientation, Feb., 2012, www.interfacebus.com/ic-semiconductor-die-cavity-orientation.html.

Bolger, Justin C., "A New Type of High Lead Count Pre-Molded PLCC", Electronic Components Conference, 1989. Proceedings., 39th, May 22-24, 1989, pp. 417-423, Dover, MA.

\* cited by examiner

PACKAGED SEMICONDUCTOR DEVICES INCLUDING PRE-MOLDED LEAD-FRAME STRUCTURES, AND RELATED METHODS AND SYSTEMS

PRIORITY CLAIM

This application claims priority under 35 U.S.C. 119(e) to U.S. Provisional Patent Application No. 61/588,769, filed Jan. 20, 2012, which is incorporated herein by reference.

BACKGROUND

Pre-molded lead-frame packages for a semiconductor structure, such as, for example, a silicon integrated circuit (IC), chip, or die, advantageously offer a small form factor. However, such packages typically have some drawbacks. For example, in such packages, the semiconductor structure is typically attached to a centrally located die attachment pad. Lead-frame fingers (which can also be referred to as lead-fingers) of the package are electronically isolated from, and mechanically connected to, the die attachment pad by a pre-molded material (e.g., an opaque epoxy) that is also used to provide pre-molded circumferential walls of the package. Bond wires are used to connect electrical terminals of the semiconductor structure to the lead-fingers. A mold material (e.g., a clear epoxy) is then used to encapsulate the top and sides of semiconductor structure and bond wires. However, the semiconductor structure and the lead-fingers have no, or limited, mechanical connection. Accordingly, relative motion between the semiconductor structure and the lead-fingers can occur, which can result in delamination of the mold material. Such relative motion can also result in broken and/or lifted wire bonds, thereby compromising wire bond integrity and the reliability of the packaged semiconductor device.

DETAILED DESCRIPTION

Figure 1A:
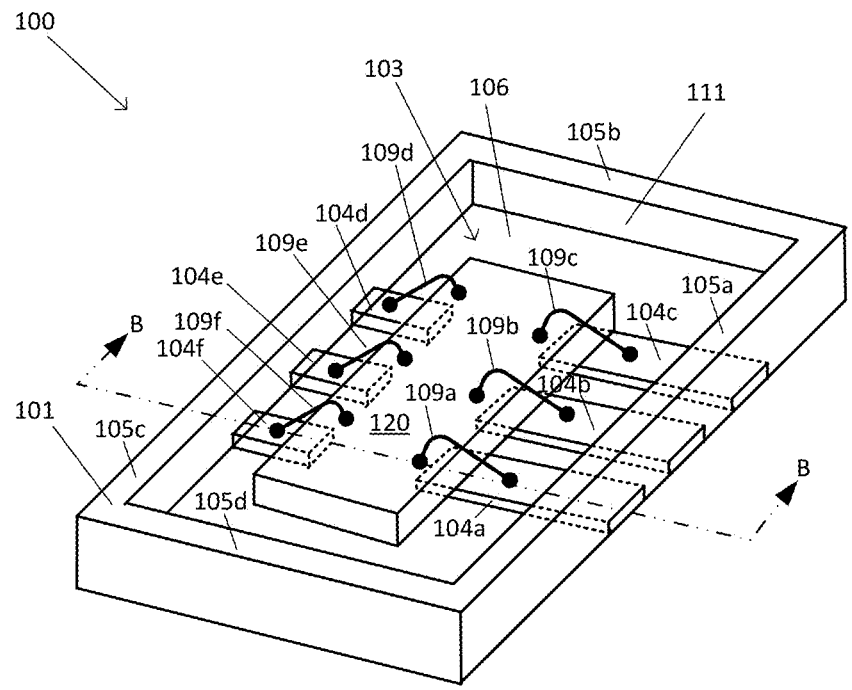
FIG. 1A illustrates a top-down perspective view of a packaged semiconductor device, according to an embodiment of the present invention.

In the following detailed description, reference is made to the accompanying drawings that form a part hereof, and in which is shown by way of illustration specific illustrative embodiments. It is to be understood that other embodiments may be utilized and that mechanical and electrical changes may be made. The following detailed description is, therefore, not to be taken in a limiting sense. In the description that follows, like numerals or reference designators will be used to refer to like parts or elements throughout. In addition, the first digit of a reference number identifies the drawing in which the reference number first appears.

Embodiments of the present invention generally relate to pre-molded lead-frame packages for a semiconductor structure, such as, for example, a silicon integrated circuit (IC), chip, or die. Such embodiments can also be referred to as packaged semiconductor devices, or more simply as packages. Embodiments of the present invention also relate to larger devices or systems including such packages, and methods for forming such packages.

In certain embodiments, a portion of a surface of each of at least two lead-fingers of a lead-frame is attached to a surface (e.g., bottom surface) of a semiconductor structure utilizing a suitable die-attach adhesive material (e.g., epoxy). No other surface of each of the lead-fingers makes contact with the die-attach adhesive material utilized. Consequently, there is substantially no relative motion between the semiconductor structure and the lead-fingers, which prevents mechanical stress from being produced on wire bond connections formed between the semiconductor structure and the lead-fingers utilized. Also, the relative motion between a mold filler material (e.g., polymer, epoxy, etc.) utilized to cover the semiconductor structure and the lead-fingers involved is reduced (e.g., compared to the relative motion produced in conventional lead-frame packages), which increases the reliability of the package by reducing the potential for delamination and broken or lifted wire bond connections caused by the relative motion between the filler material, the material (e.g., thermoplastic) utilized for the lead-frame pre-molded package, and the lead-fingers involved. Furthermore, extending the length of the lead-fingers provides a more flexible wire bond footprint available for inter-connections, and also provides a larger bonding area (e.g., compared to conventional packages) in the lead-frame structure involved.

Figure 1B:
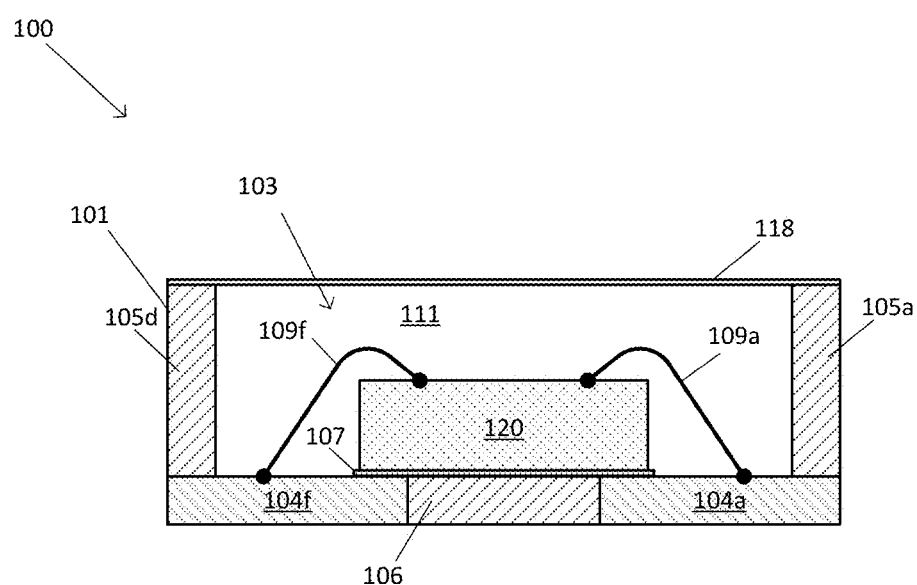
FIG. 1B illustrates a side elevation cross-sectional view of the packaged semiconductor device of FIG. 1A.

FIG. 1A illustrates a top-down perspective view of a packaged semiconductor device 100, according to an embodiment of the present invention. FIG. 1B illustrates a side elevation cross-sectional view (along line B-B in FIG. 1A) of the packaged semiconductor device 100. Referring to FIGS. 1A and 1B, the package 100 includes a plurality of lead-fingers 104a, 104b, 104c, 104d, 104e and 104f, which can individually or collectively be referred to as lead-finger(s) 104. The package 100 also includes a molded structure 101 that is molded around a portion of each of the lead-fingers 104 to thereby mechanically attach each of the fingers 104 to the molded structure 101. The molded structure 101 forms a cavity 103, which is defined by walls 105a, 105b, 105c and 105d and a floor 106 of the molded structure. The walls 105a, 105b, 105c and 105d of the molded structure, which can individually or collectively be referred to as wall(s) 105, extend generally upward from and generally perpendicular to the floor 106 of the molded structure. It is also within the scope of the present invention for the walls 105 and the lead-fingers 104 to have different shapes than are shown in the FIGS.

The molded structure 101 is molded from a molding material, such as, but not limited to, an epoxy, resin, polymer or thermoplastic. In specific embodiments, the molding material used to form the molded structure 101 is an opaque molding material, e.g., a black or other dark epoxy, resin, polymer or thermoplastic that is non-transmissive to light of wavelengths intended to be blocked.

A semiconductor structure 120 is located within the cavity 103 of the molded structure 101. As mentioned above, the semiconductor structure 120 can be, e.g., a silicon IC, a chip or a die. As can be appreciated from FIGS. 1A and 1B, a distal portion of a top surface each of the lead-fingers 104 is mechanically attached to a bottom surface of the semiconductor structure 120 to inhibit (and preferably eliminate) relative mechanical motion between the semiconductor structure 120, the molded structure 101 and the lead-fingers 104. As shown in FIG. 1B, a suitable die-attach adhesive material 107 (e.g., an epoxy) is utilized to attach the bottom surface of the semiconductor structure 120 to potions of the upper surfaces of the lead-fingers 104, as well as to a portion of the upper surface of the floor 106 of the molded structure 101. In specific embodiments, the die-attach adhesive material 107 is not electrically conductive, and the bottom of the semiconductor structure 120 is not electrically conductive. Bond wires 109a, 109b, 109c, 109d, 109e and 109f, respectively, providing electrical connections between the semiconductor structure 120 and portions of the upper surfaces of the lead-fingers 104a, 104b, 104c, 104d, 104e and 104f. The bond wires, which can individually or collectively be referred to as bond wire(s) 109 or wire bond(s) 109, transfer electrical signals between the semiconductor structure 120 and the lead fingers 104.

Portions of the molded structure 101 fill in the gaps between the multiple lead-fingers 104. For example, as can be appreciated from FIG. 1B, a portion of the floor 106 of the molded structure 101 fills in the gap between opposing ends of the lead-fingers 104a and 104f. Referring to FIG. 1A, portions of the floor 106 of the molded structure 101 similarly fill in the gap between opposing ends of the lead-fingers 104b and 104e, and the gap between opposing ends of the lead-fingers 104c and 104d. Additionally, potions of the floor 106 of the molded structure 101 fill in the gap between opposing sides of lead-fingers 104a and 104b, opposing sides of lead-finger 104b and 104c, opposing sides of lead-fingers 104d and 104e, and opposing sides of lead-fingers 104e and 104f. By filling in the gaps between the lead-fingers 104, the molded structure 101 enhances the structural integrity of the lead-fingers 104 and electrically and spatially isolates the lead-fingers 104 from one another.

Because the molded structure 101 is molded around portions of the lead-fingers 104 prior to the semiconductor structure 120 being attached within the cavity 103, the molded structure 101 and the lead-fingers 104 can be referred to collectively as a pre-molded lead-frame structure. For similar reasons, the cavity 103 can be referred to as a pre-molded cavity, the walls 105 can be referred to as pre-molded walls, the floor 106 can be referred to as a pre-molded floor, and the molding material used to form the molded structure 101 and its cavity 103 can be referred to as a pre-mold material.

As can be appreciated from FIG. 1B, a further molding material 111 encapsulates the semiconductor structure 120 and the bond wires 109 within the cavity 103. The molding material 111, which can also be referred to as a filler or filler material, is utilized to cover the semiconductor structure 120 and at least partially fill in the pre-molded cavity 103 between the (four) pre-molded walls 105 and the pre-molded floor 106. In certain embodiments where the semiconductor structure 120 is an optical sensor (e.g., an ambient light sensor, or an optical proximity sensor, or a portion thereof), the filler material 111 can be a suitable clear or otherwise light transmissive material. Similarly, if the semiconductor structure is an optically emitting device (e.g., a light emitting diode die), the filler material 111 can be a suitable clear or otherwise light transmissive material. Such a light transmissive material can be, e.g., a light transmissive epoxy (e.g., a clear or tinted epoxy), or other light transmissive resin or polymer. In certain embodiments, the light transmissive molding material may have a pigment or other property that filters out light of certain wavelengths that are not of interest, while allowing light of wavelengths of interest to pass. In certain embodiments, a further light transmissive material (e.g., a plastic or glass cover material) can optionally be utilized as a protective cover 118 over the upper surface of the mold material 111 in the pre-molded cavity 103. The filler material 111, and optionally the protective cover 118, are used to protect the semiconductor structure 120 and the bond wires 109, e.g., from mechanical damage, particles, moisture, and the like. The filler material 111 also stiffens and strengthens the entire package 100.

As can be appreciated from FIGS. 1A and 1B, each lead-finger 104 is shown as including six surfaces (which can also be referred to as six faces), as does any generally rectangular shape. A portion of one surface (the upper surface) of each lead-finger 104 is attached to the bottom surface of the semiconductor structure 120. In accordance with certain embodiments, none of the other five surfaces of each lead-finger 104 is in contact with the die attach material 107, unlike in conventional chip-on-lead (COL) packages where the die attach material (e.g., an epoxy) flows down the sides of the lead-fingers. Two adjacent surfaces (which can be referred to as the bottom and proximate surfaces) of each lead-finger 104 is exposed to outside of the packages, and thus, these two surfaces can be used to electrically connect the package 100 to an external circuit board (e.g., a printed circuit board) and/or other circuitry, e.g., by soldering. The three remaining surfaces of each lead-finger are covered with the pre-mold material.

Figure 2A:
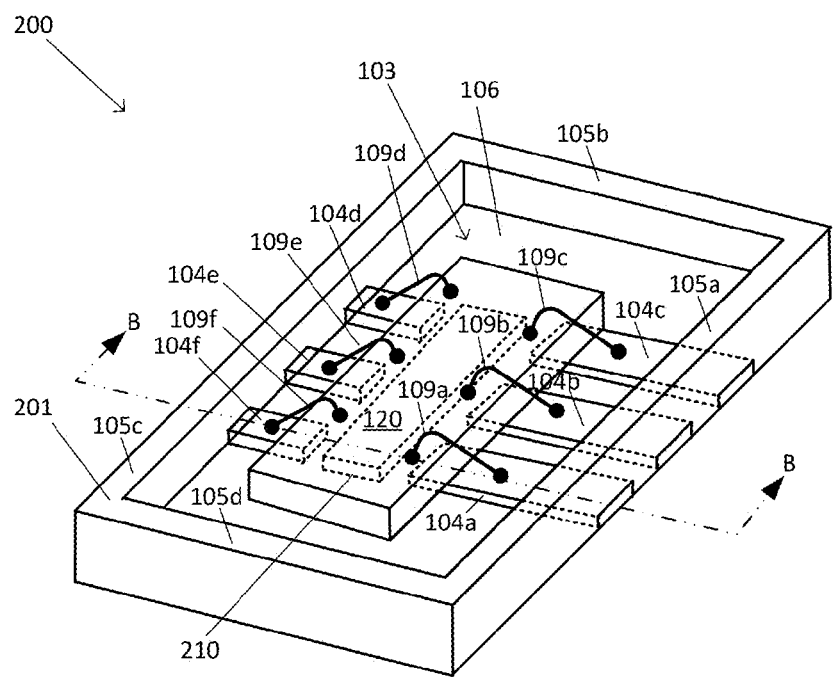
FIG. 2A illustrates a top-down perspective view of a packaged semiconductor device, according to another embodiment of the present invention.
Figure 2B:
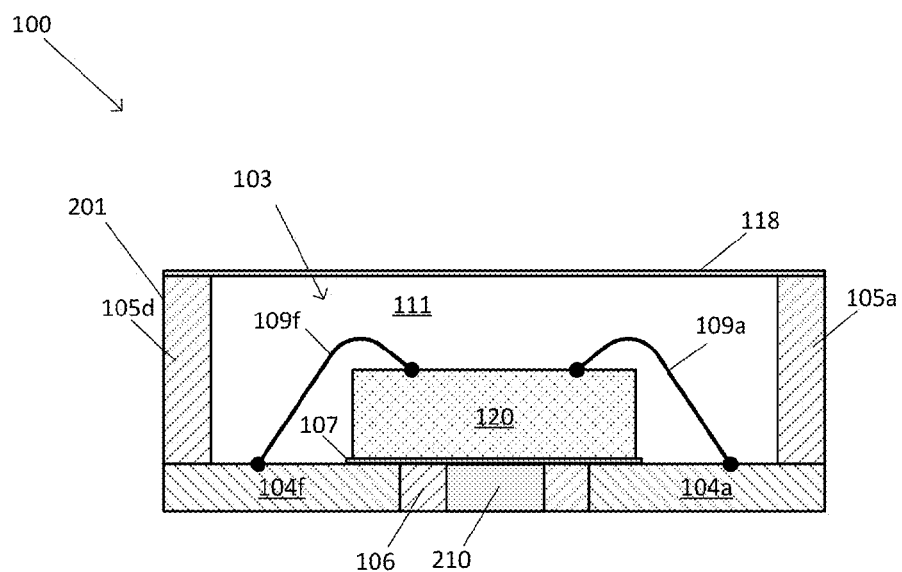
FIG. 2B illustrates a side elevation cross-sectional view of the packaged semiconductor device of FIG. 2A.

In the embodiment of the package 100 described with reference to FIGS. 1A and 1B, there is no die attach pad (also known as a die attach paddle) below the semiconductor structure 120. In an alternative embodiment, shown in FIGS. 2A and 2B, a package 200 includes a die attach pad 210 at the bottom of the cavity 103, below the semiconductor structure 120. Such a die attach pad 210 can, e.g., assist with heat dissipation. The die attach pad 210 is located between, and electrically isolated from, the lead-fingers 104. Further, as can be appreciated from FIG. 2B, portions of a molded structure 201 fill in gaps between the die attach pad 210 and the lead-fingers 104. The bottom surface of the semiconductor structure 120 is mechanically attached (e.g., by the adhesive 107) to the die attach pad 210, to the portions of the molded structure 201 that fill in the gaps, and to upper portions of the lead-fingers 104.

While the packages 100 and 200 described above were shown as and described as including six lead-fingers, it is also within the scope of the present invention for such packages to include more or less than six lead-fingers.

Figure 3:
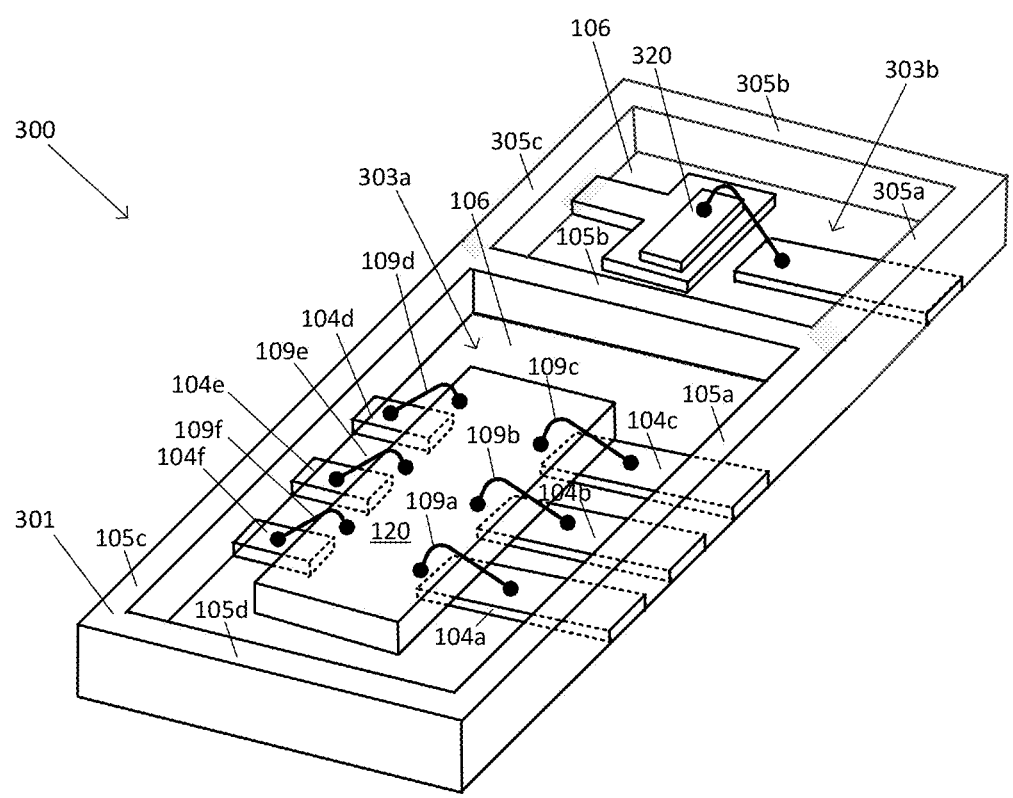
FIG. 3 illustrates a top-down perspective view of a packaged semiconductor device, according to a further embodiment of the present invention.

In further embodiments, a packaged semiconductor device can include more than one cavity and more the one semiconductor structure, as will now be described with reference to the package 300 shown in FIG. 3. Referring to FIG. 3, a molded structure 301 is shown as including two separate cavities 303a and 303b formed by walls of the molded structure 301. The semiconductor structure 120 is located and attached within the cavity 303a in the same manner that the semiconductor structure 120 was described as being attached with the cavity 103 in FIGS. 1A and 1B, or FIGS. 2A and 2B. A further semiconductor device 320 is located and attached within the other cavity 303b. Each cavity 303a and 303b can be at least partially filled with a filler material, in the same manner that the filler material 111 was described as being used to at least partially fill the cavity 103 described with reference to FIGS. 1A and 1B.

In accordance with an embodiment of the present invention, the semiconductor structure 120 is a light detector IC, chip or die, and the semiconductor structure 320 is a light emitting IC, chip or die. Each of the semiconductor structures 120 and 320 is encapsulated by a light transmissive molding material 111 within its respective cavity 303a and 303b. Such a packaged device can be used as a proximity sensor and/or an ambient light sensor. Such a light detector IC, chip or die (e.g., 120) includes one or more light detecting element, each of which can be a photoresistor, a photovoltaic cell, a photodiode, a phototransistor, or a charge-coupled device (CCD), but is not limited thereto, and preferably can be used to produce a current or voltage indicative of the magnitude and/or phase of detected light. Light detecting elements, such as those mentioned above, are also examples of optoelectronic elements. Such a light source IC, chip or die (e.g., 320) includes one or more light emitting elements, each of which can be a light emitting diode (LED), an organic LED (OLED), a bulk-emitting LED, a surface-emitting LED, a vertical-cavity surface-emitting laser (VCSEL), a superluminescent light emitting diode (SLED), a laser diode, or a pixel diode, but is not limited thereto. Light emitting elements, such as those mentioned above, are also examples of optoelectronic elements.

In FIG. 3, the molded structure 301 includes additional walls labeled 305a, 305b and 305c, relative to the molded structure 101 described above. However, the wall 305a can alternatively be considered an extension of the wall 105a, and the wall 305c can alternatively be considered an extension of the wall 105c. Here, the wall 105b acts as an optical barrier between the semiconductor structures 120 and 320, so as to optically isolate the two semiconductor structures from one another. Further lead-fingers and bond wire(s) can provide electrical connections to the semiconductor device 320, as can be appreciated from FIG. 3. The same type of configuration for attaching the semiconductor structure 120 to lead fingers 104 can also be used with the semiconductor structure 320, or a different configuration can be used, as can be appreciated from FIG. 3. One or both of the cavities 303a and 303b can be covered by a protective cover, similar to the cover 118 described above with reference to FIG. 1B. In certain embodiments, the bottom of the semiconductor structure 320 can be conductive and provide the anode or cathode attachment for the light emitting element(s), in which case the adhesive used to attach the bottom of the semiconductor structure 320 to a die attach paddle or lead-finger should be an electrically conductive adhesive.

While the packages described above were shown as and described as including either one or two pre-molded cavities, it is also within the scope of the present invention for packages to include three or more pre-molded cavities. It is also within the scope of the present invention for more than one semiconductor structure to be attached within the same cavity. Where more than one semiconductor structure with within the same cavity, they can be, e.g., located next to one another, or stacked one above the other.

The semiconductor structures (e.g., 120 and 320) are not limited to optoelectronic devices. For example, it is also within the scope of the present invention that a semiconductor device (which is attached within a pre-molded cavity of a pre-molded structure) be a microelectromechanical systems (MEMs) sensor, such as, but not limited to a pressure transducer, or an accelerometer. These are just a few examples of the types of semiconductor structures that can be located in a cavity, which are not meant to be all encompassing.

Embodiments of the present invention described herein provide multiple advantages over conventional chip-on-lead (COL) packages. For example, the lead-fingers 104 of packages of embodiments of the present invention have better structural integrity than the lead-fingers of conventional COL packages. Further, the packages of the embodiments of the present invention provide lead-fingers with better electrical and spatial isolation from one another, than is provided by conventional COL packages. Additionally, the packages of the embodiments of the present invention provide better optical isolation for semiconductor structure(s) compared to conventional COL packages. Additionally, since the semiconductor structure (e.g., 120) is attached to the molded structure (e.g., 101), the semiconductor structure helps to stiffen the entire package, enabling the entire package to be made smaller than practical with conventional packages.

Figure 4:
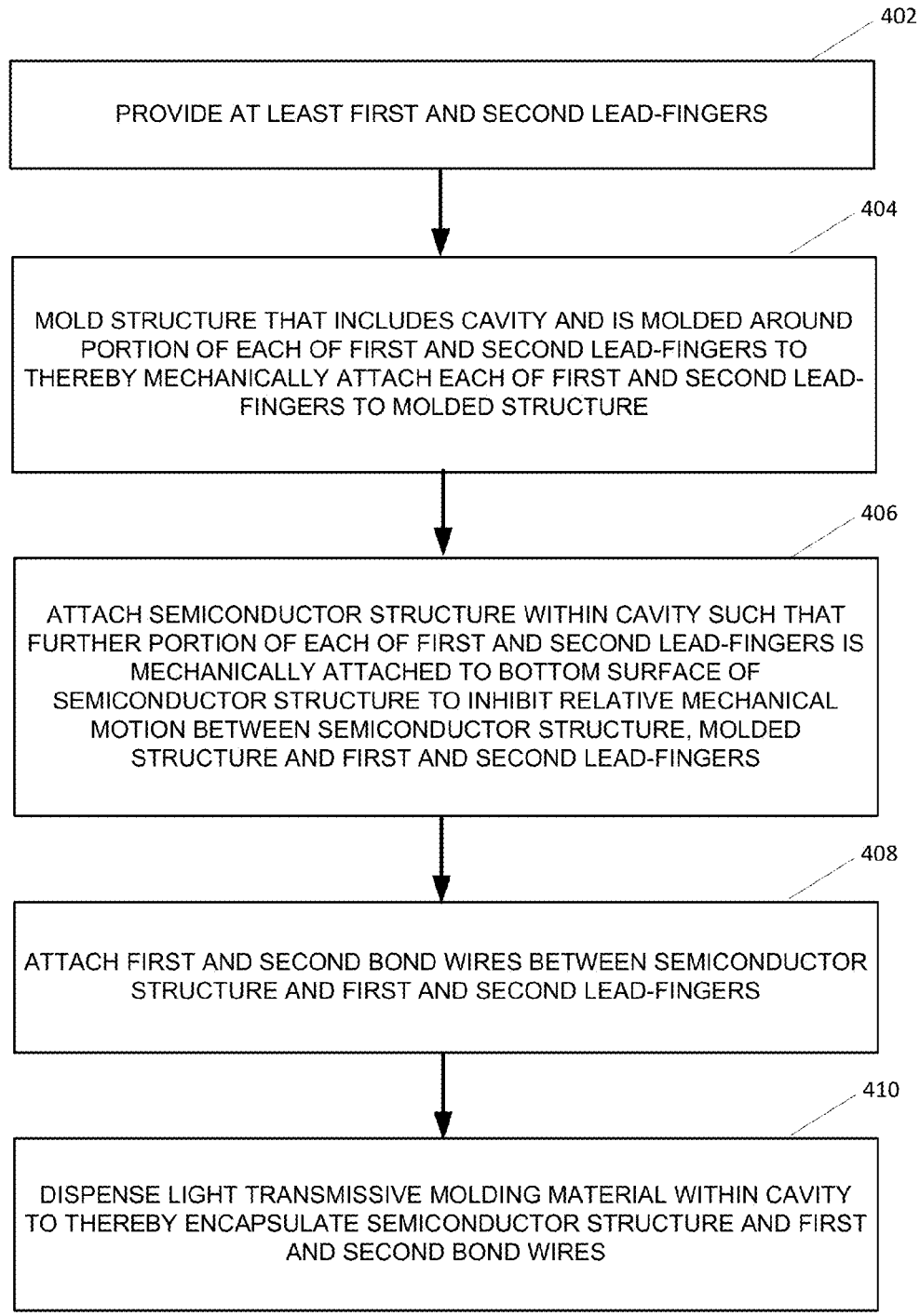
FIG. 4 is a high level flow diagram that is used to summarize methods for manufacturing packaged semiconductor devices of embodiments of the present invention.

The high level flow diagram of FIG. 4 will now be used to describe methods of manufacturing packaged semiconductor devices in accordance with various embodiments of the present invention. Referring to FIG. 4, at step 402, at least first and second lead-fingers (104) of a lead-frame are provided. At step 404, a structure (e.g., 101) is molded that includes a cavity (e.g., 103) and is molded around a portion of each of the first and second lead-fingers to thereby mechanically attach each of the first and second lead-fingers to the molded structure. Various types of types of molding techniques can be used, including, but not limited to, compression molding, transfer molding, casting, and injection molding. At step 406, a semiconductor structure (e.g., 120) is attached within the cavity such that a further portion of each of the first and second lead-fingers is mechanically attached to a bottom surface of the semiconductor structure to inhibit relative mechanical motion between the semiconductor structure, the molded structure and the first and second lead-fingers. At step 408, first and second bond wires (e.g., 109) are attached between the semiconductor structure and the first and second lead-fingers. At step 410, a light transmissive molding material (e.g., 111) is dispensed within the cavity to thereby encapsulate the semiconductor structure and the first and second bond wires. As was explained above with reference to FIG. 3, step 404 can include molding one or more additional cavity. Further, as was explained above with reference to FIG. 3, step 406 can include attaching a separate semiconductor structure (e.g., 120 and 320) within each of the cavities (e.g., 303a and 303b), when there is more than one cavity. Further, it is also within the scope of the present invention for more the one semiconductor structure to be attached with the same cavity. Additional and alternative details of such methods can be appreciated from the above description of FIGS. 1A, 1B, 2A, 2B and 3.

Figure 5:
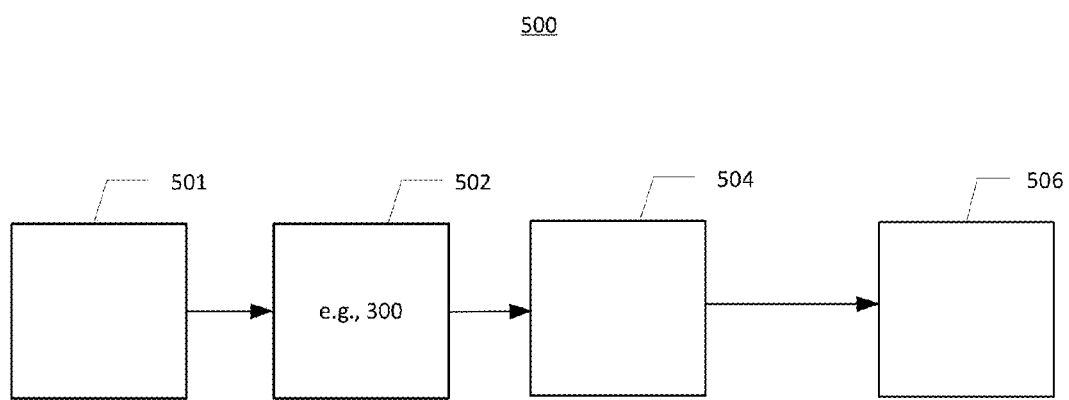
FIG. 5 is a high level block diagram of a system according to an embodiment of the present invention.

Packaged semiconductor devices of embodiments of the present invention can be used in various systems, including, but not limited to, mobile phones, tablets, personal data assistants, laptop computers, netbooks, other handheld-devices, as well as non-handheld-devices. Referring to the system 500 of FIG. 5, for example, an optoelectronic packaged semiconductor device 502 (e.g., a device that is the same as or similar to the packaged semiconductor device 300 described with reference to FIG. 3) can be used to control whether a subsystem 506 (e.g., a touch-screen, display, backlight, virtual scroll wheel, virtual keypad, navigation pad, etc.) is enabled or disabled. For example, the optoelectronic apparatus can detect when an object, such as a person's finger, is approaching, and based on the detection either enable (or disable) a subsystem 506. More specifically, an output of the optoelectronic packaged semiconductor device 502 can be provided to a comparator or processor 504 which can, e.g., compare the output of the optical sensor to a threshold, to determine whether the object is within a range where the subsystem 506 should be enabled (or disabled, depending on what is desired). Multiple thresholds (e.g., stored digital values) can be used, and more than one possible response can occur based on the detected proximity of an object. For example, a first response can occur if an object is within a first proximity range, and a second response can occur if the object is within a second proximity range. Exemplary responses can include starting or stopping, or enabling or disabling, various system and/or subsystem Where the optoelectronic packaged semiconductor device 502 is used for ambient light detection, the comparator or processor 504 can determine how to adjust the brightness of a subsystem 506 (e.g., a display or backlight). FIG. 5 also shows that a driver 501 can selectively drive one or more light emitting elements of the optoelectronic packaged semiconductor device 502.

In the discussion and claims herein, the term "on" used with respect to two materials, one "on" the other, means at least some contact between the materials, while "over" means the materials are in proximity, but possibly with one or more additional intervening materials such that contact is possible but not required. Neither "on" nor "over" implies any directionality as used herein. The terms "about" and "generally" indicates that the value or attribute listed may be somewhat altered, as long as the alteration does not result in nonconformance of the process or structure to the illustrated embodiment.

Terms of relative position as used in this application are defined based on a plane parallel to the conventional plane or working surface of a wafer or substrate, regardless of the orientation of the wafer or substrate. For example, the term "horizontal" or "lateral" defines a plane parallel to the conventional plane or working surface of a wafer or substrate, regardless of the orientation of the wafer or substrate. The term "vertical" refers to a direction perpendicular to the horizontal. Terms such as "on," "side" (as in "sidewall"), "higher," "upper," "lower," "over," "top," "bottom," and "under" are defined with respect to the conventional plane or working surface being on the top surface of the wafer or substrate, regardless of the orientation of the wafer or substrate.

Although specific embodiments have been illustrated and described herein, it will be appreciated by those of ordinary skill in the art that any arrangement, which is calculated to achieve the same purpose, may be substituted for the specific embodiments shown. Therefore, it is manifestly intended that the present invention be limited only by the claims and the equivalents thereof.

While various embodiments of the present invention have been described above, it should be understood that they have been presented by way of example, and not limitation. It will be apparent to persons skilled in the relevant art that various changes in form and detail can be made therein without departing from the spirit and scope of the invention.

The breadth and scope of the present invention should not be limited by any of the above-described exemplary embodiments, but should be defined only in accordance with the following claims and their equivalents.

What is claimed is:

1. A packaged semiconductor device, comprising:
a pre-molded lead-frame structure including
  first and second lead-fingers; and
  a molded structure that forms a pre-molded cavity and is molded around portions of each of the first and second lead-fingers to thereby mechanically attach each of the first and second lead-fingers to the molded structure;
  wherein the molded structure includes pre-molded walls and a pre-molded floor that define the pre-molded cavity; and
  wherein an upper surface of the pre-molded floor is substantially coplanar with a portion of an upper surface of each of the first and second lead-fingers;
a semiconductor structure within the pre-molded cavity of the pre-molded lead-frame structure, the semiconductor structure including a top surface and a bottom surface; and
first and second bond wires respectively providing electrical connections between the semiconductor structure and the first and second lead-fingers of the pre-molded lead-frame structure;
wherein a portion of the upper surface each of the first and second lead-fingers of the pre-molded lead-frame structure is mechanically attached to the bottom surface of the semiconductor structure to inhibit relative mechanical motion between the semiconductor structure, the molded structure and the first and second lead-fingers of the pre-molded lead-frame structure.

2. The device of claim 1, wherein:
a portion of the pre-molded floor of the molded structure fills in a gap between the first and second lead-fingers of the pre-molded lead-frame structure; and
the bottom surface of the semiconductor structure is mechanically attached, by an adhesive, to the portion of the pre-molded floor of the molded structure that fills in the gap.

3. The device of claim 1, further comprising:
a die attach pad located between, and electrically isolated from, the first and second lead-fingers of the pre-molded lead-frame structure;
wherein portions of the molded structure fill in gaps between the die attach pad and the first and second lead-fingers of the pre-molded lead-frame structure; and
wherein the bottom surface of the semiconductor structure is mechanically attached by an adhesive to the die attach pad and to the portions of the molded structure that fill in the gaps.

4. The device of claim 1, further comprising:
a material that encapsulates the semiconductor structure and the first and second bond wires within the pre-molded cavity of the pre-molded lead-frame structure.

5. The device of claim 4, further comprising:
a further semiconductor structure that is also attached within the pre-molded cavity of the pre-molded lead-frame structure;
wherein the material also encapsulates the further semiconductor structure within the pre-molded cavity of the pre-molded lead-frame structure.

6. The device of claim 1, further comprising:
a second pre-molded cavity of the pre-molded lead-frame structure also formed by the molded structure; and
a further semiconductor structure within the second pre-molded cavity of the pre-molded lead-frame structure.

7. The device of claim 6, further comprising:
a material that encapsulates the semiconductor structure and the first and second bond wires within the pre-molded cavity of the pre-molded lead-frame structure, and that encapsulates the further semiconductor within the second pre-molded cavity of the pre-molded lead-frame structure.

8. The device of claim 1, wherein the semiconductor structure is selected from the group consisting of:
an integrated circuit (IC);
a chip; and
a die.

9. The device of claim 1, further comprising:
a light transmissive molding material that encapsulates the semiconductor structure and the first and second bond wires within the pre-molded cavity of the pre-molded lead-frame structure; and
wherein the molded structure that forms the pre-molded cavity of the pre-molded lead-frame structure is molded of an opaque molding material.

10. The device of claim 1, wherein:
the semiconductor structure includes an optical sensor that is adapted to produce a signal indicative of light incident on the optical sensor; and
at least one of the first and second bond wires provides the signal to at least one of the first and second lead-fingers of the pre-molded lead-frame structure.

11. The device of claim 10, further comprising:
a second pre-molded cavity of the pre-molded lead-frame structure also formed by the molded structure; and
a further semiconductor structure within the second pre-molded cavity of the pre-molded lead-frame structure;
wherein the further semiconductor structure includes a light emitting element; and
wherein the optical sensor and the light emitting element are optically isolated from one another by an opaque barrier wall that is formed by the molded structure and that separates the first and second pre-molded cavities of the pre-molded lead-frame structure.

12. The device of claim 1, wherein:
the portion of the upper surface of each of the first and second lead-fingers of the pre-molded lead-frame structure, which is mechanically attached to the bottom surface of the semiconductor structure, is mechanically attached by an adhesive;
each of the first and second lead-fingers of the pre-molded lead-frame structure includes six faces;
the portion of the upper surface of each of the first and second lead-fingers of the pre-molded lead-frame structure, which is mechanically attached by the adhesive to the bottom surface of the semiconductor structure, is a portion of only one of the six faces of each of the first and second lead-fingers of the pre-molded lead-frame structure; and
none of the other five faces of the first and second lead-fingers of the pre-molded lead-frame structure is in contact with the adhesive.

13. The device of claim 1, wherein the semiconductor structure includes a microelectromechanical systems (MEMS) sensor.

14. The device of claim 1, wherein the pre-molded walls of the molded structure extend generally upward from and generally perpendicular to the pre-molded floor of the molded structure.

15. A packaged semiconductor device, comprising:
a pre-molded lead-frame structure including a group of lead-fingers; and
an opaque molded structure that forms a first pre-molded cavity and a second pre-molded cavity and is molded around portions of each of the lead-fingers of the group of lead-fingers to thereby mechanically attach each of the lead-fingers of the group of lead fingers to the portion of the molded structure the forms the first pre-molded cavity;
wherein the opaque molded structure includes pre-molded walls and a pre-molded floor that define the first and second pre-molded cavities; and
wherein an upper surface of the pre-molded floor is substantially coplanar with a portion of an upper surface of each of the lead-fingers of the group of lead-fingers;
a first semiconductor structure within the first pre-molded cavity of the pre-molded lead-frame structure, the first semiconductor structure including a top surface and a bottom surface; and
bond wires that provide electrical connections between the first semiconductor structure and the lead-fingers of the group of lead-fingers of the pre-molded lead-frame structure;
wherein a portion of the upper surface of each of the lead-fingers of the group of lead-fingers of the pre-molded lead-frame structure is mechanically attached to the bottom surface of the first semiconductor structure to inhibit relative mechanical motion between the first semiconductor structure, the molded structure and each of the lead-fingers of the group of lead-fingers of the pre-molded lead-frame structure;
a second semiconductor structure within the second pre-molded cavity of the pre-molded lead-frame structure; and
a fill material that encapsulates the first semiconductor structure within the first pre-molded cavity of the pre-molded lead-frame structure and encapsulates the second semiconductor structure within the second pre-molded cavity of the pre-molded lead-frame structure.

16. The device of claim 15, wherein:
the first semiconductor structure comprises at least one light detecting element; and
the second semiconductor structure comprises at least one light emitting element.

* * * * *